(12) United States Patent
Matsunami

(10) Patent No.: US 8,422,306 B2
(45) Date of Patent: Apr. 16, 2013

(54) NON-VOLATILE SEMICONDUCTOR MEMORY DEVICE

(75) Inventor: Junya Matsunami, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 53 days.

(21) Appl. No.: 13/239,572

(22) Filed: Sep. 22, 2011

(65) Prior Publication Data

US 2012/0140558 A1 Jun. 7, 2012

(30) Foreign Application Priority Data

Dec. 6, 2010 (JP) ................................. 2010-271122

(51) Int. Cl.
*G11C 11/34* (2006.01)
*G11C 16/06* (2006.01)
*G11C 16/04* (2006.01)

(52) U.S. Cl.
USPC ............ 365/185.23; 365/185.03; 365/185.17; 365/185.18; 365/185.19; 365/185.22

(58) Field of Classification Search ............ 365/185.17, 365/185.18, 185.19, 185.22, 185.23
See application file for complete search history.

(56) References Cited

U.S. PATENT DOCUMENTS

2010/0322012 A1* 12/2010 Suzuki et al. ............ 365/185.24
2010/0329013 A1* 12/2010 Shikata et al. ........... 365/185.18

FOREIGN PATENT DOCUMENTS

| JP | 2000-113686 | 4/2000 |
| JP | 2005-267687 | 9/2005 |
| JP | 2009-70501 | 4/2009 |

OTHER PUBLICATIONS

U.S. Appl. No. 13/237,291, filed Sep. 20, 2011, Kamigaichi, et al.

* cited by examiner

*Primary Examiner* — Ly D Pham
(74) *Attorney, Agent, or Firm* — Oblon, Spivak, McClelland, Maier & Neustadt, L.L.P.

(57) ABSTRACT

A control circuit applies a write pulse voltage to a selected word line to perform a write operation to 1-page memory cells along the selected word line. The circuit then performs a verify read operation to confirm whether the data write to the 1-page memory cells is completed. According to the result of the verify read operation, a step-up operation is performed out to raise the write pulse voltage by a step-up voltage. The control circuit changes the amount of the step-up voltage according to a distribution width of a first threshold voltage distribution generated in process of the write operation to the memory cells.

20 Claims, 9 Drawing Sheets

Lower Page PRG

Upper Page PRG

NON-VOLATILE SEMICONDUCTOR MEMORY DEVICE

CROSS REFERENCE TO RELATED APPLICATIONS

This application is based on and claims the benefit of priority from prior Japanese Patent Application No. 2010-271122, filed on Dec. 6, 2010, the entire contents of which are incorporated herein by reference.

FIELD

Embodiments described herein relates to a non-volatile semiconductor memory device.

BACKGROUND

A flash memory is widely used as a semiconductor memory. A flash memory utilizes a memory cell that belongs to a type of accumulating a charge in a floating gate. A Flash memory is widely used because it is a non-volatile device, as well as it provides a lower cost per 1-bit data and it can be highly integrated. Among others, a NAND flash memory can be particularly highly integrated because it includes a plurality of memory cells connected in series between select transistors, thereby providing fewer contacts between the memory cells. A multi-level storage product has been available that stores 2-bit or more data per one memory cell. Such a product can also provide a higher storage capacity, a lower cost, and a smaller space.

A data write operation (program operation) of the NAND flash memory requires a verify read operation to confirm whether a targeted threshold voltage is acquired. If the verify read operation shows that the number of cells that have not reached the desired threshold voltage (the verify voltage) is larger than a certain number, the write voltage is raised (which is referred to as a step-up operation) and then similar write and verify read operations are repeated until the desired threshold voltage is acquired.

In a highly integrated flash memory having scaled-down cells, fluctuation in the number of injected electrons and interference between adjacent memory cells have effects on the threshold voltage distribution of the memory cell, such as increasing the distribution width and entirely moving the distribution. Particularly, the multi-level storage scheme requires setting of a smaller width of the threshold voltage distributions and a smaller distance between the threshold voltage distributions than in the case of the binary storage scheme. Accordingly, when the multi-level storage scheme is used, adjacent-cell interference may greatly affects on the data reliability. Various methods of data write have thus been proposed to minimize the affect of the adjacent-cell interference.

Provision of threshold voltage distributions having a smaller distribution width and a smaller distance therebetween usually needs a smaller step-up width (the increase width) in the step-up operation. A smaller step-up width results in, however, a longer write time and reduced performance of the non-volatile semiconductor memory device. Accordingly, there is a need for a proposed non-volatile semiconductor memory device having a reduced write time while maintaining the data reliability.

DETAILED DESCRIPTION

Figure 1:
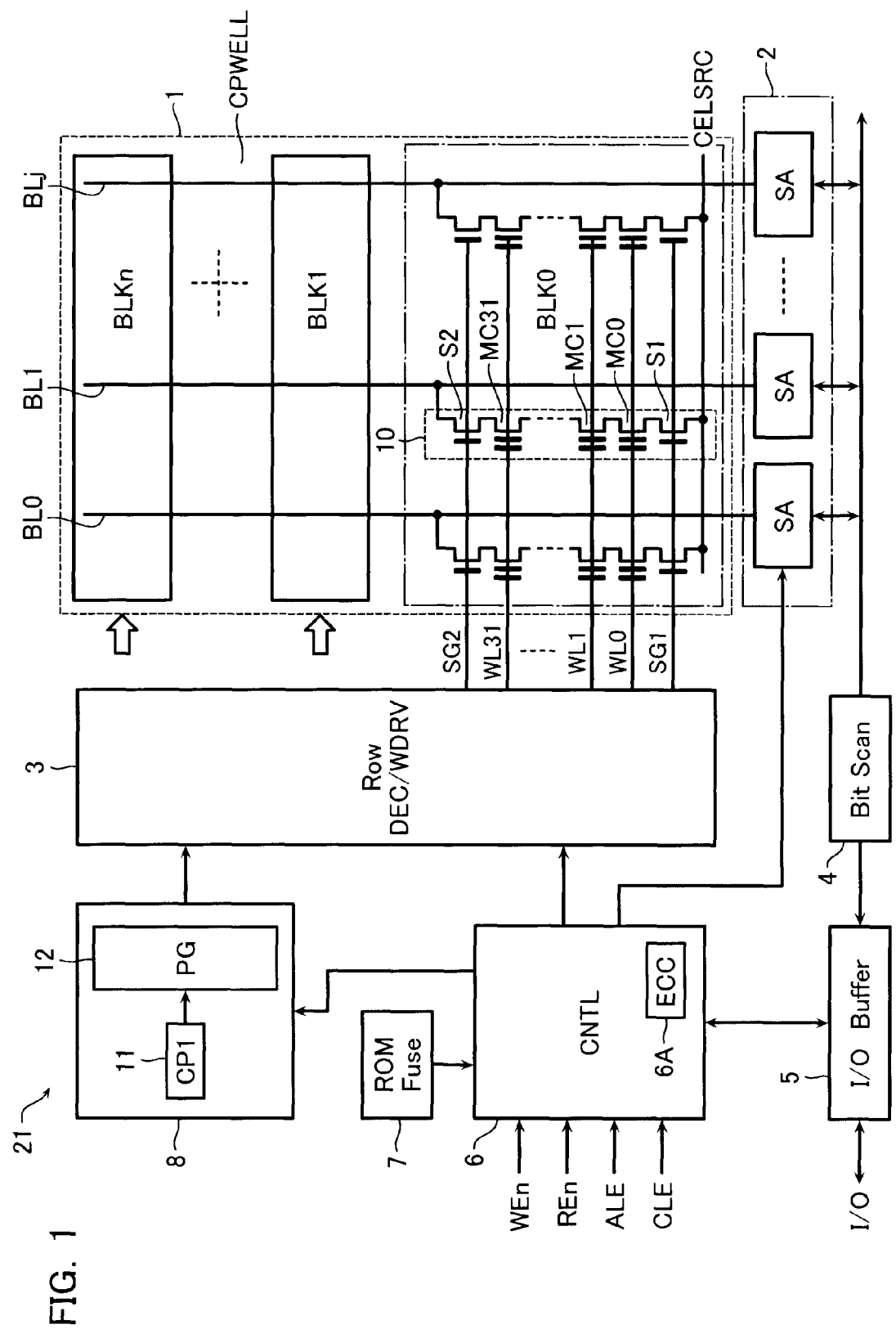
FIG. 1 illustrates a schematic configuration of a NAND flash memory 21 according to a first embodiment.

A non-volatile semiconductor memory device according to this embodiment includes a memory cell array, the memory cell array including a plurality of blocks, each block including a set of NAND cell units, each NAND cell unit including a memory string and a first and a second select gate transistor connected to the respective ends of the memory string, the memory string including a plurality of non-volatile memory cells connected in series. A word line is commonly connected to the control gates of the memory cells arranged in a first direction. A bit line is connected to a first end portion of each NAND cell unit. A source line is connected to a second end portion of each NAND cell unit. A sense amplifier circuit senses a potential or a current of the bit line to determine data held in the memory cell. A control circuit applies a write pulse voltage to a selected word line to perform a write operation to 1-page memory cells along the selected word line, and then carries out a verify read operation to confirm whether the data write to the 1-page memory cells is completed, and according to the result of the verify read operation, carries out a step-up operation to raise the write pulse voltage by a step-up voltage, and carries out again the write operation. The control circuit changes the amount of the step-up voltage according to a distribution width of a first threshold voltage distribution generated in process of the write operation to the memory cells.

Embodiments of the present invention will now be described in more detail referring to the drawings.

[First Embodiment]

FIG. 1 illustrates a schematic configuration of a NAND flash memory 21 according to a first embodiment of the present invention. With reference to FIG. 1, the NAND flash memory 21 includes a memory cell array 1, a sense amplifier circuit 2, a row decoder 3, a bit scan circuit 4, an input/output buffer 5, a control circuit 6, a ROM fuse 7, and a voltage generation circuit 8. The control circuit 6 provides a control portion for the memory cell array 1.

The memory cell array 1 includes a plurality of NAND cell units 10 arranged in a matrix. Each NAND cell unit 10 includes a memory string and select gate transistors S1 and S2 connected to the respective ends of the memory string, the memory string including a plurality of memory cells MC (MC0, MC1, ..., and MC31) connected in series.

Although not shown, each memory cell MC may include, as well known, a gate-insulating film (a tunnel insulating film) formed between the drain and the source, a floating gate electrode as a charge accumulation layer formed on the gate-insulating film, an inter-gate dielectric film formed on the floating gate electrode, and a control gate electrode formed on the inter-gate dielectric film. The control gate is connected to one of the word lines.

The source of the select gate transistor S1 is connected to a common source line CELSRC. The drain of the select gate transistor S2 is connected to a bit line BL.

In each NAND cell unit 10, the control gates of the memory cells MC are connected to different word lines WL (WL0, WL1, ..., and WL31). The gates of the select gate transistors S1 and S2 are connected to select gate lines SG1 and SG2, respectively, running in parallel with the word lines WL. A set of memory cells sharing one word line form one or more pages depending on the bit number stored in one memory cell. A set of NAND cell units 10 sharing the word lines WL and the select gate lines SG1 and SG2 provides a block BLK as a unit of data erase.

With reference to FIG. 1, the memory cell array 1 includes a plurality of blocks BLK (BLK0, BLK1, ..., and BLKn) in the bit line BL direction. The memory cell array 1 including these blocks is formed in one cell well (CPWELL) on a silicon substrate.

The bit lines BL of the memory cell array 1 are connected to the sense amplifier circuit 2. The sense amplifier circuit 2 includes a plurality of sense amplifiers SA. The circuit 2 provides a page buffer for sensing read data and holding write data. The sense amplifier circuit 2 includes a column selection gate. The row decoder (including a word line driver) 3 selectively drives the word lines WL and the select gate lines SG1 and SG2.

As a result of the verify read operation after the program operation, read data is held in the page buffer of the sense amplifier circuit 2. The bit scan circuit 4 counts, according to the read data, the verify pass bit number to determine whether or not the count is equal to or more than a certain number. According to the determination of the bit scan circuit 4, the control circuit 6 determines whether the write to the memory cells along one word line WL is completed. Also, according to the determination of the bit scan circuit 4, the control circuit 6 changes a step-up voltage $\Delta$VPGM of a write pulse voltage VPGM, as described below.

Figure 2:
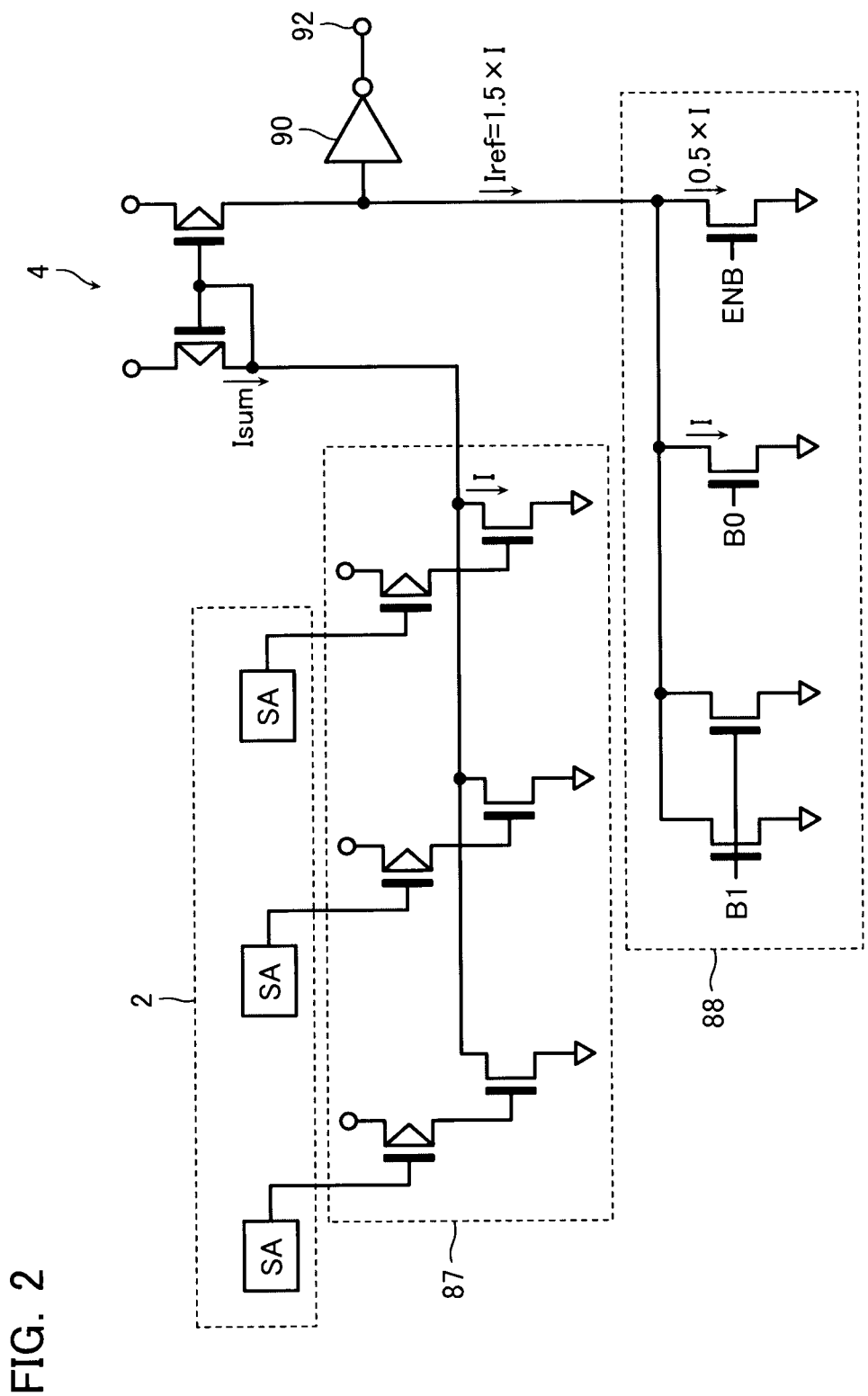
FIG. 2 is a circuit diagram showing an example configuration of the bit scan circuit 4 in FIG. 1.

FIG. 2 shows an example circuit configuration of the bit scan circuit 4. The bit scan circuit 4 includes a sense current path 87, a reference constant current path 88, an inverter 90, and an output node 92. The sense amplifier circuit 2 for one page holds pass/fail data as a verify read result. It is assumed here that an "H" level is held when the verify read result is "PASS" and an "L" level is held for "FAIL."

The bit scan circuit 4 of the above configuration operates to detect, from the output node 92 of the inverter 90, a differential current between a current Isum through the sense current path 87 and a reference current Iref through the reference constant current path 88. The reference constant current path 88 includes MOS transistors. Signals B0 and B1 are supplied to the gate terminals of the MOS transistors. The signals B0 and B1 are set according to the reference value to be compared with the verify pass bit number.

Referring back to FIG. 1, the data input/output buffer gives and receives data among an external input/output terminal, the sense amplifier circuit 2 and the bit scan circuit 4. The buffer 5 also receives command data and address data.

The control circuit 6 receives external control signals such as a write enable signal WEn, a read enable signal REn, an address latch enable signal ALE, and a command latch enable signal CLE, and controls the overall memory operation.

Specifically, the control circuit 6 includes a command interface and an address hold/transfer circuit and determines whether supplied data is write data or address data. In response to this determination, write data is transferred to the sense amplifier circuit 2 and address data is transferred to the row decoder 3 and the sense amplifier circuit 2. The control circuit 6 also controls, according to the external control signal, the sequence of read and write/erase and an applied voltage or the like.

The voltage generation circuit 8 includes a booster circuit 11 and a pulse generation circuit 12.

Figure 3:
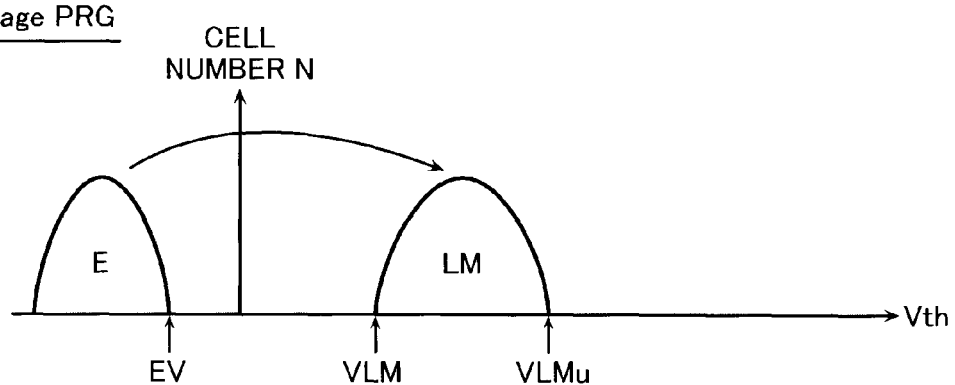
FIG. 3 is a schematic diagram of a procedure of a write operation for storing 2-bit data per one memory cell.
Figure 3:
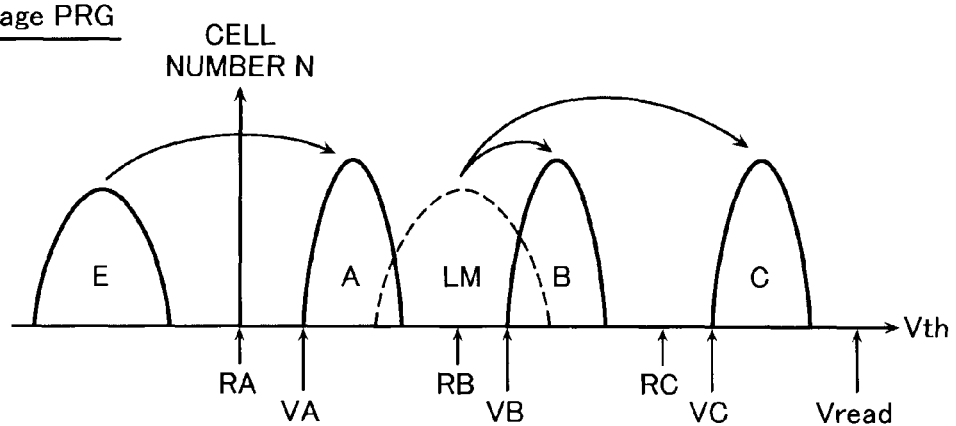

FIG. 3 shows an example method of data write for a four-level data storage scheme (2 bits/cell) in a NAND cell flash memory according to this embodiment. Four-level data is defined by, for example, a negative threshold voltage distribution (an erase distribution) E at the lowest voltage level and threshold voltage distributions A, B, and C at higher voltage levels.

To write four-level data, all memory cells in the selected block are first set to the lowest negative threshold voltage distribution E. The data erase is carried out by providing a positive erase voltage Vera from the well driver 6 to the well where the memory cell array 1 is formed in order to set all or part of the word lines to voltages lower than the Vera, thereby discharging electrons from the floating gates of all or part of the memory cells M.

A lower page write (Lower Page Program) is then carried out that writes to some of the cells having the threshold voltage distribution E to an intermediate distribution LM. In this lower page write, a verify voltage is set to a voltage VLM (applying the voltage VLM between the control gate and the source of the selected memory cell M), and a verify read operation is carried out for every write operation to confirm whether the write to the intermediate distribution LM is completed.

An upper page write (Upper Page Program) is then carried out that raises the threshold voltage from the threshold voltage distribution E to an distribution A and also from the intermediate distribution LM to threshold voltage distributions B and C. In this upper page write operation, the verify read operation is carried out using a voltage VA, VB, or VC as the verify voltage. Note that in the read operation after the write operation is completed, the read voltage applied across the control gate and source of the selected memory cell M is set to a read voltage RA, RB, or RC that is a voltage between the upper limit and lower limit of each of the threshold voltage distributions of E to C, while an unselected memory cell is applied with a read-pass voltage Vread that is high enough to render the channel conductive.

The above data write is carried out as an operation of selectively injecting electrons into the floating gate of the memory cell according to the following procedure: providing the selected word line with the write pulse voltage VPGM; providing the unselected word line with a write pass voltage Vpass; and providing the bit line with the ground voltage Vss (for the data "0" write to raise the threshold voltage), a midpoint potential VQPW between the power supply voltage Vdd and the ground voltage Vss (for the data "0" write to slowly raise the threshold voltage), or the power supply voltage Vdd (for the write inhibit not to raise the threshold voltage (the data "1" write)).

Figure 4:
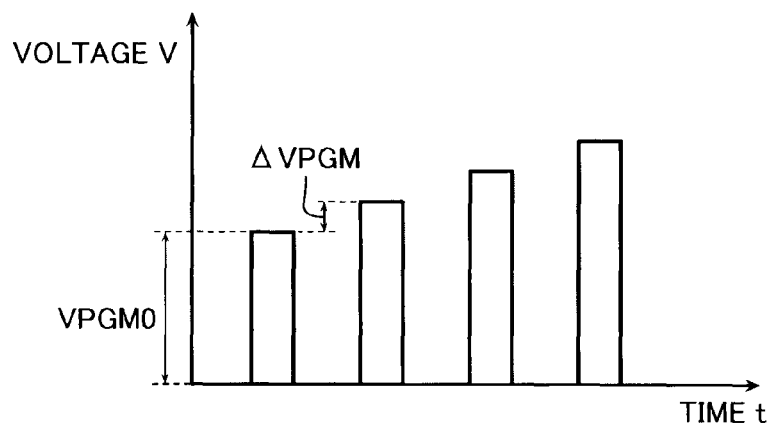
FIG. 4 is a schematic diagram illustrating a write operation to the NAND flash memory 21 according to the first embodiment.

Specifically, for the data "0" write, the ground voltage Vss or the midpoint potential VQPW provided to the bit line BL is transferred to the channel of the NAND cell unit, and when the write pulse voltage VPGM is provided, electrons are injected from the channel into the floating gate by a tunnel current. For the "1" write (the write inhibit), the NAND cell channel is charged to Vdd−Vt (Vt is the threshold voltage of a drain-side select gate transistor SG0) to become floating, and when the write pulse voltage VPGM is provided, the cell channel is boosted by the capacitive coupling, thus preventing the electron injection. The data write uses a step up write scheme that increases the write pulse voltage by a certain step-up voltage ΔVPGM as shown in FIG. 4 for every write cycle (including the write operation and the verify read operation).

In the lower page write (the write of the intermediate distribution LM), the write state is confirmed (the verify read operation) to make the lower limit of the threshold voltage of the intermediate distribution LM equal to or more than a certain voltage (the verify voltage VLM). Specifically, in the verify read operation providing the verify voltage VLM across the control gate (the selected word line) and source of the selected memory cell, if the selected memory cell is rendered conductive, then the write is determined to be failed (fail), and if it is not rendered conductive, then the write is determined to be successful (pass). Then in the write operation, the bit line of the memory cell in which the write is successful is provided with the power supply voltage Vdd to inhibit the write, and the bit line of the memory cell in which the write is failed is provided with the ground voltage Vss or the midpoint voltage VQPW to write data "0." Similarly, in the upper page write, the verify voltages VA, VB, and VC are used to perform the verify read operation of the data states A, B, and C, respectively.

By the way, due to the progress in scaling down of memory cells, fluctuation in the number of injected electrons and interference between adjacent memory cells during the write operation to the memory cell may vary the threshold voltage distribution. This results in increasingly high requirements for smaller distribution width of the threshold voltage distribution. The distribution width of the threshold voltage distribution may be decreased by setting a smaller step-up voltage ΔVPGM. Uniformly decreasing the step-up voltages ΔVPGM may, however, result in a lower write speed.

In the control according to this embodiment, therefore, after the write operation of the intermediate distribution LM is completed, the distribution width of the intermediate distribution LM is determined, and according to the determination, the amount of the step-up voltage ΔVPGM used in the following upper page write is changed. Specifically, the larger the distribution width of the intermediate distribution LM is, the smaller the step-up voltage ΔVPGM is set. It is likely that a larger width of the intermediate distribution LM results in larger distribution widths of the threshold voltage distributions A, B, and C. The larger the width of the intermediate distribution LM is, therefore, the smaller the amount of the step-up voltage ΔVPGM must be set. This can limit the increase of the distribution widths of the threshold voltage distributions A, B, and C. Conversely, it is likely that if the intermediate distribution LM has a smaller distribution width, a similar write condition results in that the following upper page write will provide threshold voltage distributions A, B, and C that also have relatively small distribution widths. For a smaller width of the intermediate distribution LM, therefore, the step-up voltage ΔVPGM may be increased to improve the write speed. With such a control, the data reliability may be maintained and the write speed may be improved at the same time.

Figure 5A:
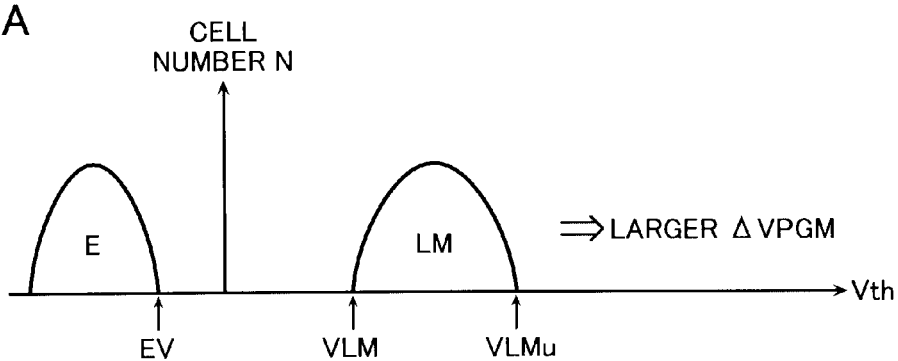
FIG. 5A is a schematic diagram illustrating a write operation to a NAND flash memory according to a second embodiment.

The distribution width of the intermediate distribution LM is determined as follows, for example. After the write operation of the intermediate distribution LM is completed, the read operation is carried out using a read voltage VLMu larger by a certain voltage (for example, 1.5 V) than the verify voltage VLM. With reference to FIG. 5A, for a smaller distribution width of the intermediate distribution LM, much of the intermediate distribution LM is distributed over a range lower than the read voltage VLMu. In the read operation using the read voltage VLMu, therefore, most of the memory cells output "1," and fewer memory cells output data "0."

Figure 5B:
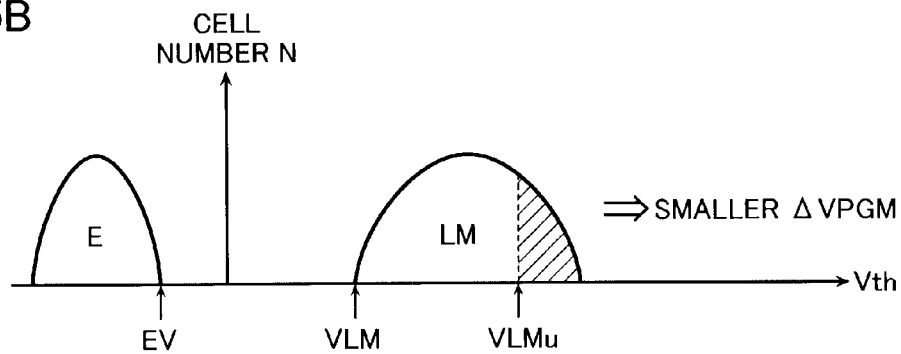
FIG. 5B is a schematic diagram illustrating the write operation to a NAND flash memory according to the second embodiment.

With reference to FIG. 5B, for a larger distribution width of the intermediate distribution LM, a portion of the intermediate distribution LM is distributed over a range higher than the read voltage VLMu. In such a situation, if the read operation is carried out using the read voltage VLMu, the number of memory cells that output data "0" is larger than that in FIG. 5A. Specifically, the number of memory cells that output data "0 in the read operation using the read voltage VLMu may be compared to determine the distribution width of the intermediate distribution LM. Note that the number of memory cells that output data "0" may be counted by the bit scan circuit 4.

Figure 6:
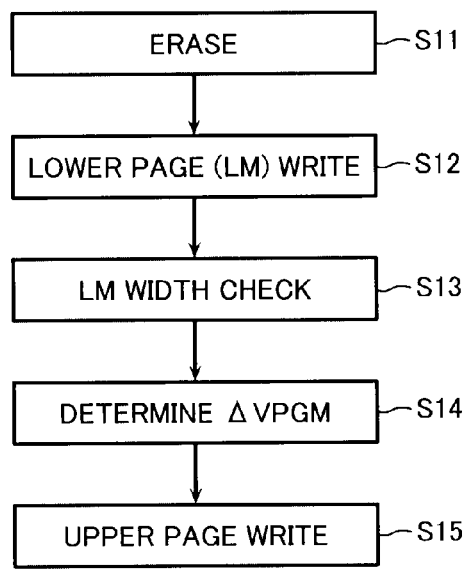
FIG. 6 is a flowchart of an example procedure for performing a write scheme of 2 bits/cell in the NAND flash memory 21 according to the first embodiment.

With reference now to the flowchart in FIG. 6, a description is given of a procedure of the write operation by a NAND flash memory according to this embodiment.

First, the block to be written is subjected to the erase operation (S11). Then, the block is subjected to the lower page write to provide the intermediate distribution LM to the desired memory cells (S12). Then, the read operation is carried out using the read voltage VLMu, and among the memory cells to which the threshold voltage distribution LM is provided, the number of memory cells from which "0" is read is counted by the bit scan circuit 4. According to the count result, the distribution width of the intermediate distribution LM is determined (S13). According to the determination, then, the amount of the step-up voltage ΔVPGM is determined (S14). Using the determined step-up voltage ΔVPGM, then the upper page write is carried out (S15).

[Second Embodiment]

Figure 7:
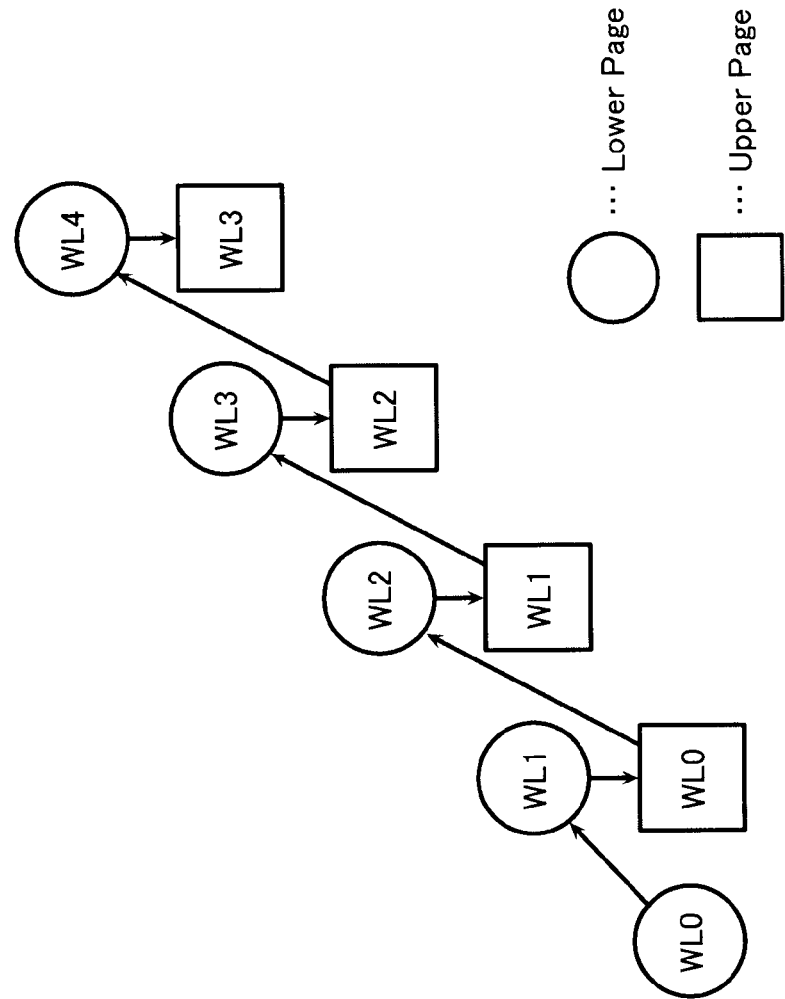
FIG. 7 is a schematic diagram of an example procedure for performing a write scheme of a four-level data storage scheme (2 bits/cell) in a NAND flash memory according to the second embodiment.
Figure 7:
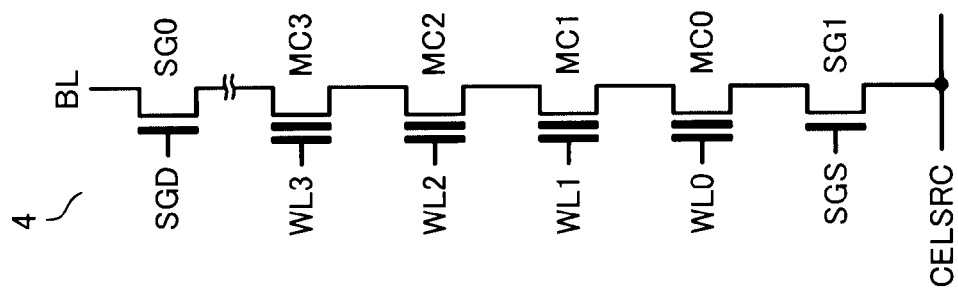

With reference now to FIG. 7, a description is given of a NAND flash memory according to a second embodiment of the present invention. The schematic structure of the NAND flash memory 21 is generally similar to that in the first embodiment, and thus the detailed description is omitted here. Also like the first embodiment, the 2 bits/cell write includes writing of the intermediate distribution LM as shown in FIG. 3. Note, however, that the procedure of the data write to the NAND cell unit in this embodiment is different from that in the first embodiment.

This embodiment uses the write procedure as shown in FIG. 7. Generally, in the NAND cell flash memory, the write is carried out sequentially in one NAND cell unit from the memory cell MC0 nearest to the common source line CELSRC and finally to the farthest memory cell M31.

Further in this embodiment, as shown in FIG. 7, to limit the interference effect by the adjacent memory cell, after the lower page write to one memory cell MCi is completed, the upper page write to the same memory cell MCi is not carried out, and instead, the lower page write to the adjacent memory cell MCi+1 is carried out. Then, returning to the memory cell MCi, the upper page write is carried out. Such a write procedure may minimize the variation of the threshold voltage distribution.

Figure 8:
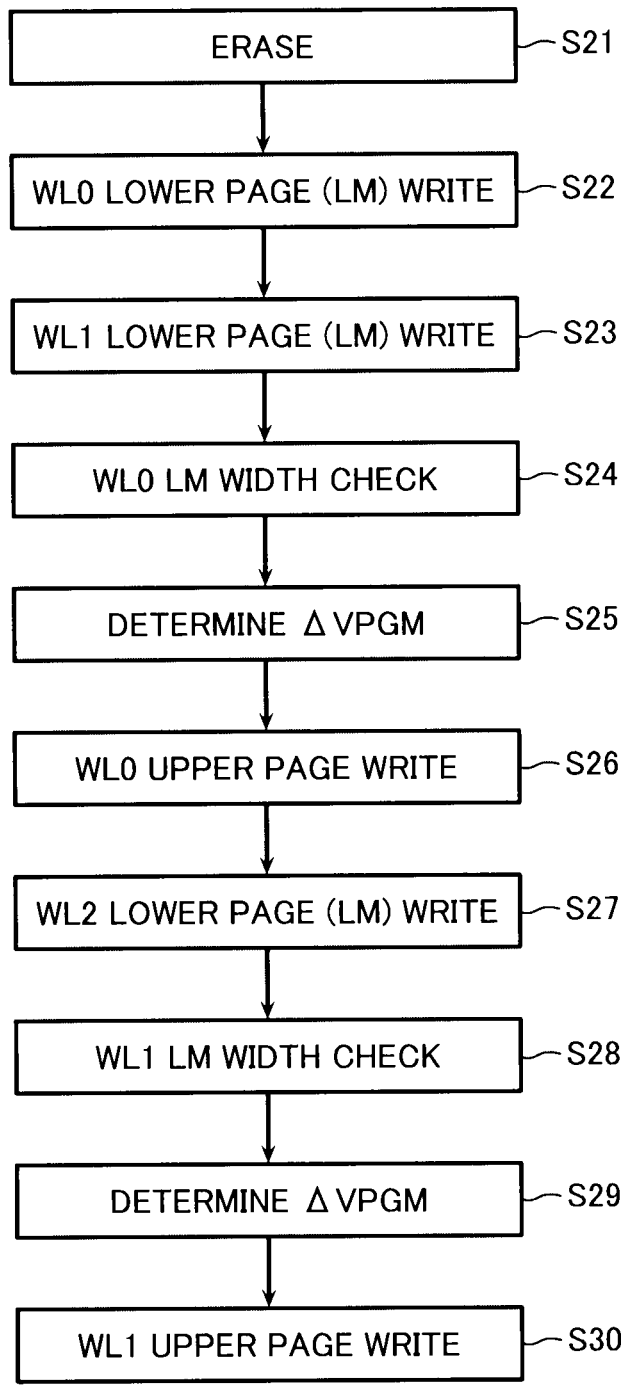
FIG. 8 is a flowchart of an example procedure for performing the write scheme of the four-level data storage scheme (2 bits/cell) in a NAND flash memory according to the second embodiment.

With reference to FIG. 7 and the flowchart in FIG. 8, the specific write procedure will be described below. After the data erase operation is carried out to the subject block (S21 in FIG. 8), the lower page write is carried out to the memory cells MC0 along the word line WL0 nearest to the common source line CELSRC (S22). Then, the lower page write is carried out to the memory cells MC1 along the adjacent word line WL1 (S23). Then, returning to the word line WL0, the word line WL0 is subjected to the read operation with an application of the read voltage VLMu to determine the distribution width of the intermediate distribution LM (S24). According to the determination, the step-up voltage ΔVPGM is determined (S25). The upper page write operation according to this determined step-up voltage ΔVPGM is carried out to the memory cells MC0 along the word line WL0 (S26).

In the next step, the lower page write is carried out to a word line WL2 two lines away from the word line WL0 (S27) in the bit line BL direction.

Then, returning to the word line WL1, the word line WL1 is subjected to the read operation with an application of the read voltage VLMu to determine the distribution width of the intermediate distribution LM (S28). According to the determination, the step-up voltage ΔVPGM is determined (S29). The upper page write operation according to this determined step-up voltage ΔVPGM is carried out to the memory cells MC1 along the word line WL1 (S30). The procedure from S27 to S30 is then repeated until the upper page write to the memory cells MC31 is completed.

In addition, after the lower page write to the adjacent word line WL1 is carried out (S23) and before the upper page write is carried out, the distribution width of the intermediate distribution LM is checked (S24). This may allow for checking of the distribution width of the intermediate distribution LM after the shift amount due to the lower page write to the word line WL1 is reflected. This may further limit the increase of the distribution widths of the threshold voltage distributions A, B, and C.

[Third Embodiment]

With reference now to the schematic diagrams in FIGS. 9 and 10 and the flowchart in FIG. 11, a NAND flash memory according to a third embodiment of the present invention will be described. The schematic structure of the NAND flash memory 21 is generally similar to that in the first embodiment, and thus the detailed description is omitted here. This third embodiment provides an example NAND flash memory that is adapted to be able to write in an eight-value data storage scheme (3 bits/cell).

Figure 9:
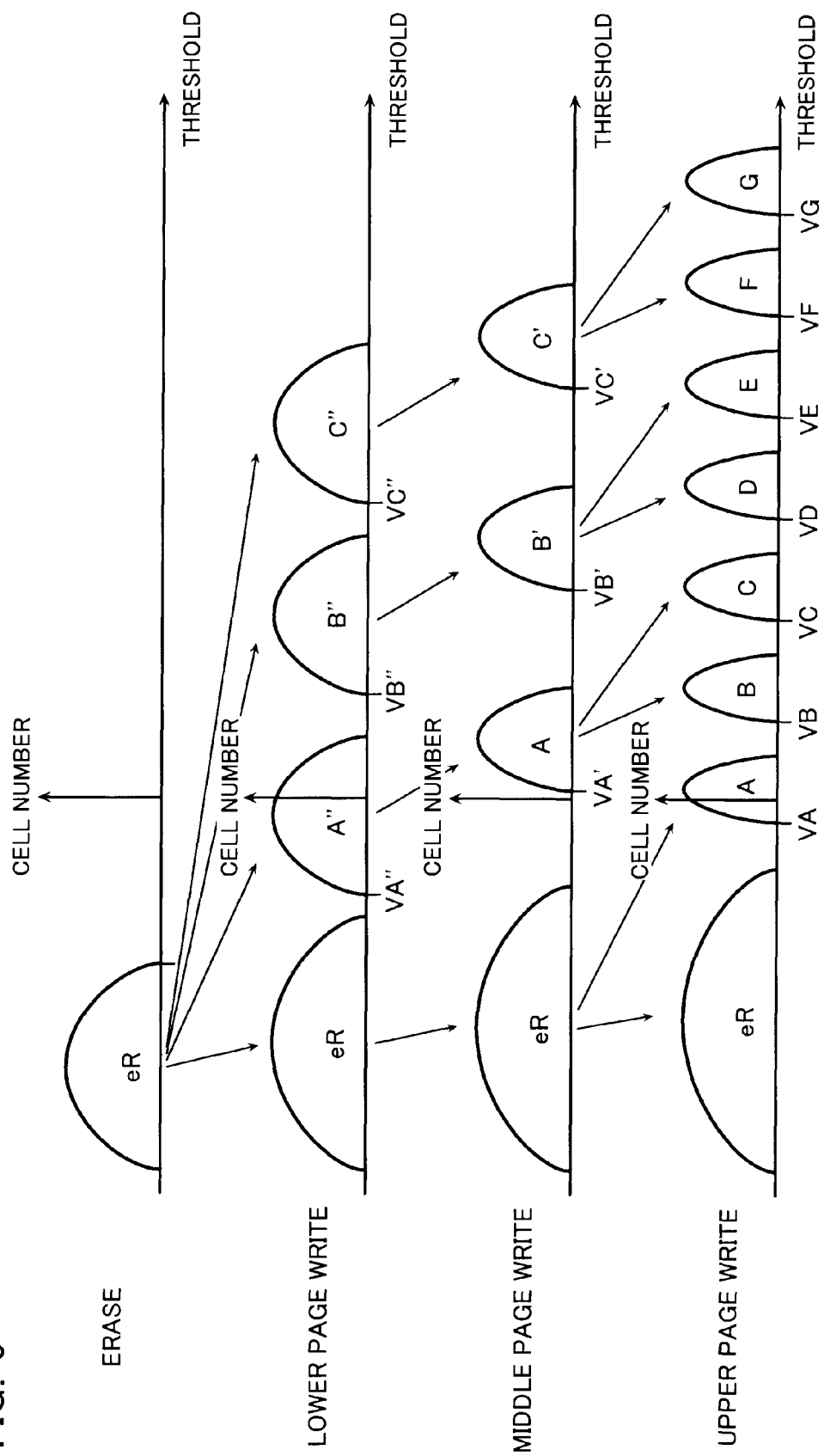
FIG. 9 is a schematic diagram of a procedure of a write operation of (an eight-value data storage scheme, 3 bits/cell) for storing data of 3 bits/one memory cell according to a third embodiment.

FIG. 9 shows an example data write method for performing the eight-value data storage scheme in a NAND cell flash memory according to this embodiment. Eight-level data is defined by, for example, a negative threshold voltage distribution (an erase distribution) eR at the lowest voltage level and threshold voltage distributions A to G at higher voltage levels.

To write eight-level data, all memory cells in the selected block are first set to the lowest negative threshold voltage distribution eR. The data erase is carried out by providing a positive erase voltage Vera from the well driver 6 to the well where the memory cell array 1 is formed in order to set all or part of the word lines to voltages lower than the Vera, thereby discharging electrons from the floating gates of all or part of the memory cells M. Then, using the verify voltages VA", VB", and VC", a program operation (the lower page write (Lower Page Program)) is carried out that provides midpoint threshold voltage distributions A", B", and C" each having a larger distribution width.

Then, using verify voltages VA', VB', and VC', a program operation (a middle page write (Middle Page Program)) is carried out that provides midpoint threshold voltage distributions A', B', and C' from the distributions A", B", and C". In the middle page write, the distribution width of any of the midpoint threshold voltage distributions A", B", and C" after the lower page write is determined in a similar manner to that in which the distribution width of the intermediate distribution LM is determined in the above embodiments. According to the determination, the step-up voltage ΔVPGM may be determined and then be used in the middle page data write.

Then, the write operation is further carried out from the threshold voltage distributions eR, A', B', and C' provided by the middle page data write. The upper page data write operation (Upper Page Data Program) is thus carried out to provide the final threshold voltage distributions eR, and A to G. The upper page data write operation includes the following steps: write from the threshold voltage distribution eR to the distribution A; write from the intermediate distribution A' to the threshold voltage distribution B or C; write from the intermediate distribution B' to the threshold voltage distribution D or E; and write from the intermediate distribution C' to the threshold voltage distribution F or G.

In this upper page write, the verify read operation is carried out using voltages VA to VG as the verify voltage. Note that in the read operation after the write operation, the read voltage applied across the control gate and source of the selected memory cell M is set to a read voltage RA, RB, . . . , or RG that is a voltage between the upper limit and lower limit of each of the threshold voltage distributions of eR to G, while an unselected memory cell is applied with a read-pass voltage Vread that is high enough to render the channel conductive.

In addition, just like the distribution widths of the midpoint threshold voltage distributions A", B", and C" is determined after the lower page data write operation is completed, the distribution widths of the midpoint threshold voltage distributions A', B', and C' are determined after the middle page data write operation is completed. According to the determination, the step-up voltage ΔVPGM is determined and is then used in the following upper page write operation.

Figure 10:
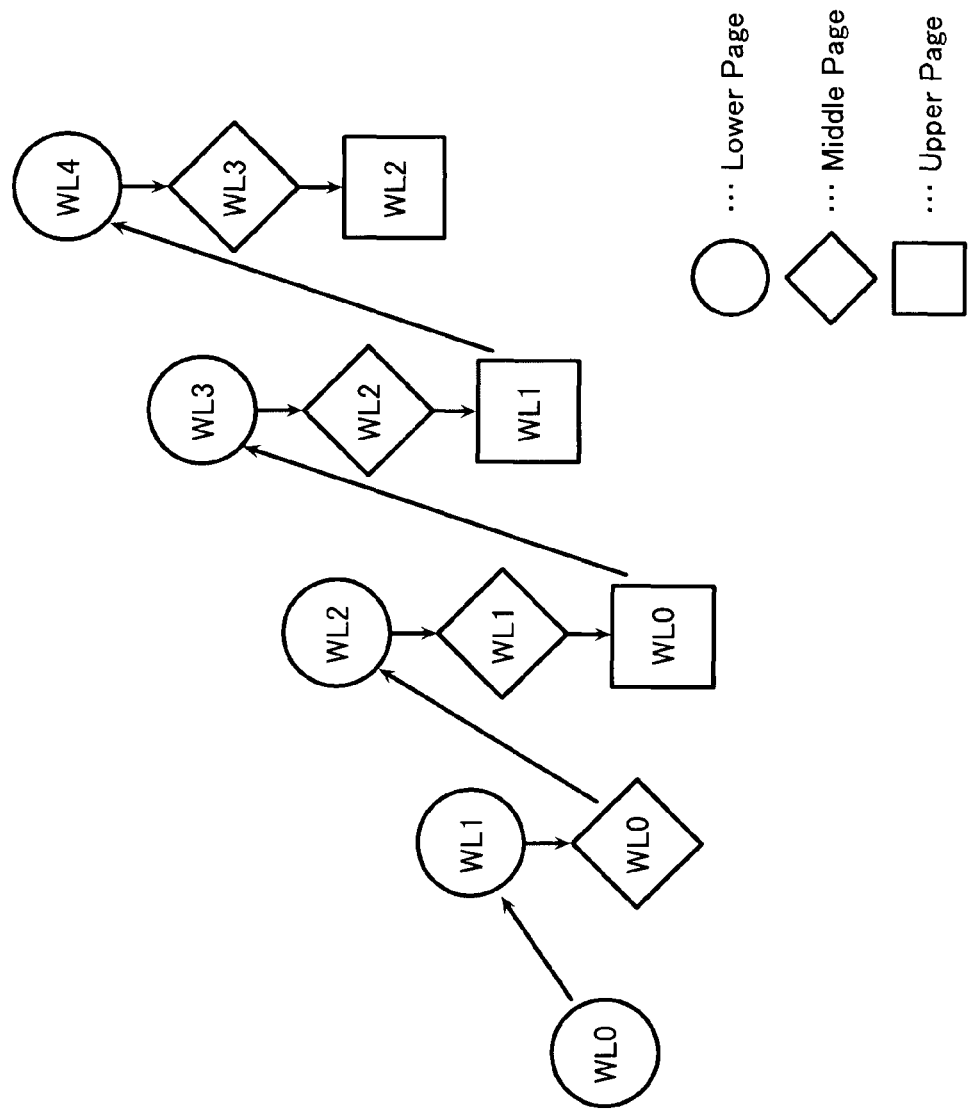
FIG. 10 is a schematic diagram of an example procedure for performing the write scheme of the eight-value data storage scheme (3 bits/cell) in a NAND flash memory according to the third embodiment.
Figure 10:
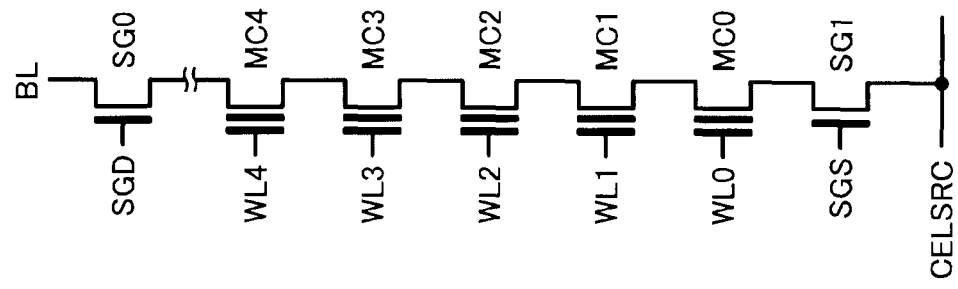
Figure 11:
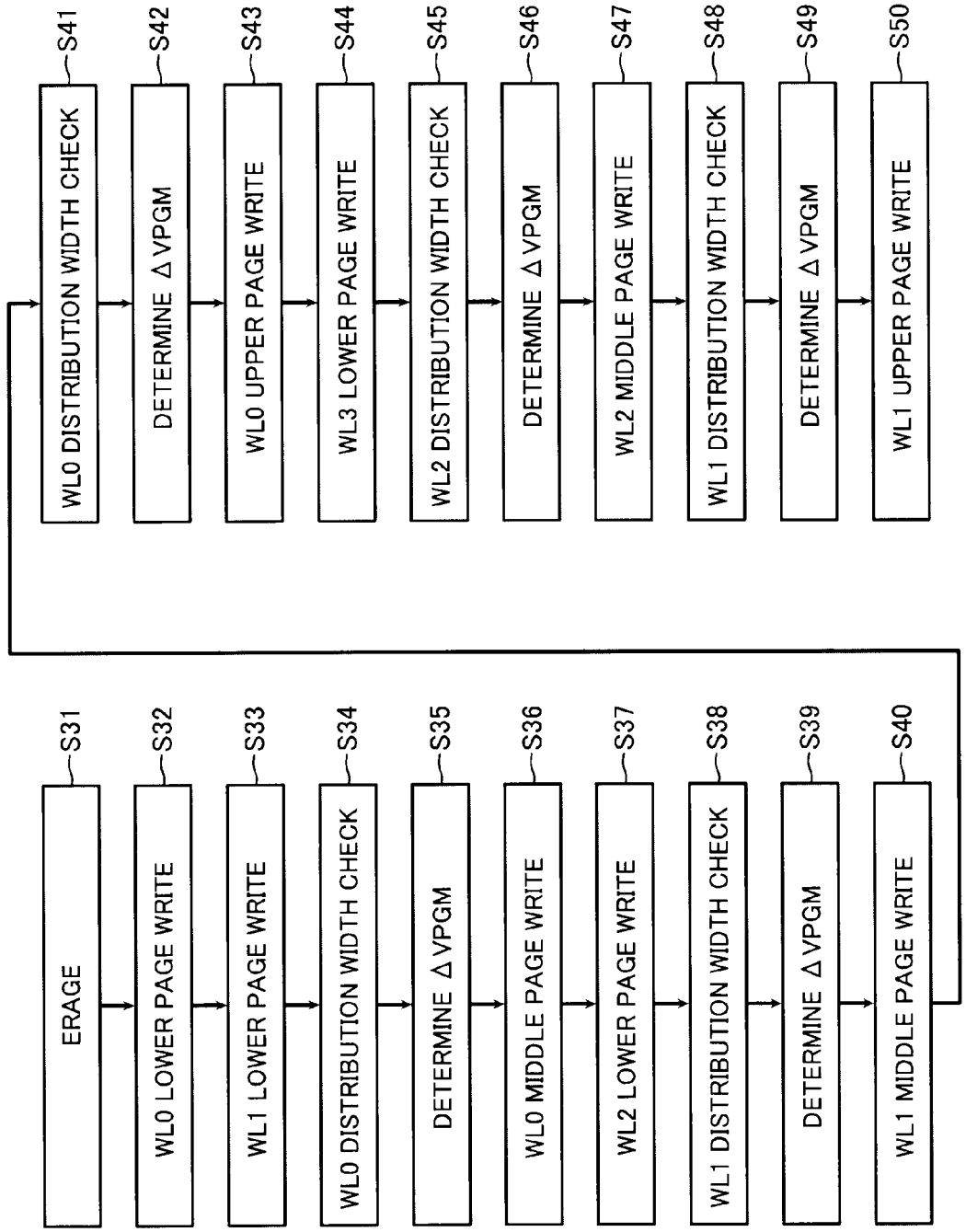
FIG. 11 a flowchart of an example procedure for performing the write scheme of the eight-value data storage scheme (3 bits/cell) in a NAND flash memory according to the third embodiment.

This embodiment uses the write procedure as shown in FIG. 10. Like the second embodiment, the write is carried out sequentially in one NAND cell unit from the memory cell MC0 nearest to the common source line CELSRC and finally to the farthest memory cell M31.

Further in this embodiment, to limit the interference effect by the adjacent memory cell, as shown in FIG. 10, after the lower page data write to one memory cell MCi is completed, the middle page data write or the upper page data write to the same memory cell MCi is not carried out, and instead, the lower page data write to the adjacent memory cell MCi+1 is carried out. Then, returning to the memory cell MCi, the middle page data write is carried out.

After the middle page data write to the memory cell MCi is completed, the lower page write is carried out to the memory cell MCi+2 adjacent to the memory cell MCi+1. Then, returning to the memory cell MCi+1, the middle page write is carried out. Then, returning to the memory cell MCi, the upper page data write is carried out. Such a write procedure may minimize the variation of the threshold voltage distribution even for eight threshold voltage distributions.

With reference to the flowchart in FIG. 11, the specific procedure of the write scheme in FIG. 10 will be described. After the data erase operation is carried out to the subject block (S31 in FIG. 11), the lower page write is carried out to the memory cells MC0 along the word line WL0 nearest to the common source line CELSRC (S32). Then, the lower page write is carried out to the memory cells MC1 along the adjacent word line WL1 (S33). Then, returning to the word line WL0, the word line WL0 is subjected to the read operation of applying the read voltage larger by a certain voltage than the verify voltage VA", VB"", or VC" to determine the distribution width of the threshold voltage distribution A", B", or C" (S34). According to the determination, the step-up voltage ΔVPGM is determined (S35). The middle page data write operation according to this determined step-up voltage ΔVPGM is carried out to the memory cells MC0 along the word line WL0 (S36).

In the next step, the lower page write is carried out to the word line WL2 two lines away from the word line WL0 (S37) in the bit line BL direction.

Then, returning to the word line WL1, the distribution width of the threshold voltage distribution A", B" or C" at the word line WL1 is determined (S38). According to the determination, the step-up voltage ΔVPGM is determined (S39). The middle page write operation according to this determined step-up voltage ΔVPGM is carried out to the memory cells MC1 along the word line WL1 (S40).

Then, returning to the word line WL0, the distribution width of the threshold voltage distribution A', B' or C' at the word line WL0 is determined (S41). According to the determination, the step-up voltage ΔVPGM is determined (S42). The upper page write operation according to this determined step-up voltage ΔVPGM is carried out to the memory cells MC0 along the word line WL0 (S43). As shown in steps S44 to S50 in FIG. 11, a similar procedure is repeated to other memory cells.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

In the above embodiments, for example, when the write operation for writing the intermediate distribution LM as shown in FIG. 3 is used, the distribution width of the intermediate distribution LM is determined, and according to the determination, the step-up voltage ΔVPGM is determined. In the same way, midpoint threshold voltage distributions A", B", and C" and midpoint threshold voltage distributions A', B', and C' are used for determining the step-up voltage ΔVPGM of the following write operation. The present invention may also include determining the distribution width of any threshold voltage distribution generated after the erase operation is carried out and before the final threshold voltage distribution is provided, and according to the determination, determining the step-up voltage ΔVPGM of the following write operation.

Also although, for example, in the above embodiments, the number of memory cells connected in series is 32, the number is not limited to 32. The number may be, for example, 64 or 128.

Also although, for example, the above embodiments are described with respect to examples of the 2 bits/cell write and the 3 bits/cell write, the write is not limited to those. The write may be, for example, 4 bits/cell or 5 bits/cell.

Also although, for example, the above embodiments use examples of the floating gate electrode as the charge accumulation layer, the charge accumulation layer is not limited to the floating gate electrode. The charge accumulation layer may be, for example, an insulator film including charge trap property.

What is claimed is:

1. A non-volatile semiconductor memory device comprising:
a memory cell array comprising a set of NAND cell units, each NAND cell unit comprising a memory string and first and second select gate transistors connected to the respective ends of the memory string, the memory string comprising a plurality of non-volatile memory cells connected in series;
a word line commonly connected to the control gates of the memory cells arranged in a direction intersecting the memory string;
a bit line connected to a first end portion of each NAND cell unit;
a source line connected to a second end portion of each NAND cell unit;
a sense amplifier circuit configured to sense a potential or a current of the bit line to determine data held in the memory cell; and
a control circuit configured to apply a write pulse voltage to a selected word line to perform a write operation to 1-page memory cells along the selected word line, and then perform a verify read operation to confirm whether data write to the 1-page memory cells is completed or not, and according to the result of the verify read operation, perform a step-up operation to raise the write pulse voltage by a step-up voltage, and perform the write operation again, the amount of the step-up voltage being changed according to a distribution width of a first threshold voltage distribution generated during a process of the write operation to the memory cells.

2. The non-volatile semiconductor memory device according to claim 1, wherein
the control circuit performs a read operation to a memory cell having the first threshold voltage distribution using a voltage larger by a certain value than a verify voltage used for write of the first threshold voltage distribution, and according to read data, the control circuit changes the step-up voltage.

3. The non-volatile semiconductor memory device according to claim 1, wherein
the non-volatile memory cells are configured to store four-level data,
the first threshold voltage distribution is an intermediate distribution generated from a negative threshold voltage distribution,
the control circuit changes the step-up voltage according to a distribution width of the intermediate distribution.

4. The non-volatile semiconductor memory device according to claim 1, further comprising a bit scan circuit configured to determine the number of non-volatile memory cells that are determined to have reached a certain threshold voltage among the plurality of memory cells that are read at the same time, according to read data determined in the sense amplifier circuit by the verify read operation,
 wherein the control circuit determines the distribution width of the first threshold voltage distribution, according to the determination by the bit scan circuit, and changes the amount of step-up voltage, according to the determination.

5. The non-volatile semiconductor memory device according to claim 1, wherein
 the control circuit decreases the amount of the step-up voltage as the distribution width of the first threshold voltage distribution increases.

6. The non-volatile semiconductor memory device according to claim 2, wherein
 the first threshold voltage distribution is an intermediate distribution generated only in process of a series of write operation and verify read operation, the intermediate distribution being different from a final threshold voltage distribution as a threshold voltage distribution given to the memory cell after the write operation and verify read operation are completed,
 the control circuit changes the step-up voltage according to a distribution width of the intermediate distribution.

7. The non-volatile semiconductor memory device according to claim 2, further comprising a bit scan circuit configured to determine, according to read data determined in the sense amplifier circuit by the verify read operation, the number of non-volatile memory cells that are determined to have reached a certain threshold voltage among the plurality of memory cells that are read at the same time,
 wherein the control circuit determines, according to the determination by the bit scan circuit, the distribution width of the first threshold voltage distribution, and changes, according to the determination, the amount of step-up voltage.

8. The non-volatile semiconductor memory device according to claim 2, wherein
 the control circuit decreases the amount of the step-up voltage as the distribution width of the first threshold voltage distribution increases.

9. The non-volatile semiconductor memory device according to claim 3, further comprising a bit scan circuit configured to determine the number of non-volatile memory cells that are determined to have reached a certain threshold voltage among the plurality of memory cells that are read at the same time, according to read data determined in the sense amplifier circuit by the verify read operation,
 wherein the control circuit determines the distribution width of the first threshold voltage distribution, according to the determination by the bit scan circuit, and changes the amount of step-up voltage, according to the determination.

10. The non-volatile semiconductor memory device according to claim 3, wherein
 the control circuit decreases the amount of the step-up voltage as the distribution width of the first threshold voltage distribution increases.

11. The non-volatile semiconductor memory device according to claim 4, wherein
 the control circuit decreases the amount of the step-up voltage as the distribution width of the first threshold voltage distribution increases.

12. The non-volatile semiconductor memory device according to claim 1, wherein
 the non-volatile memory cells configured to store eight-level data,
 the first threshold voltage distribution is first midpoint threshold distributions generated from a negative threshold voltage distribution and second midpoint threshold distributions generated from the first midpoint threshold distributions,
 the control circuit changes the step-up voltage according to a distribution width of the first and the second midpoint threshold distributions.

13. The non-volatile semiconductor memory device according to claim 1, wherein the control circuit is configured to sequentially perform:
 a write operation of a first page to a first memory cell;
 a write operation of the first page to a second memory cell nearer to the bit line than the first memory cell;
 a write operation of a second page to the first memory cell;
 a write operation of the first page to a third memory cell nearer to the bit line than the second memory cell; and
 a write operation of the second page to the second memory cell.

14. The non-volatile semiconductor memory device according to claim 13, wherein
 the control circuit is configured to perform, before performing the write operation of the second page to each memory cell, a read operation to confirm the distribution width of the first threshold voltage distribution provided by the write operation to the first page.

15. A method of writing to a non-volatile semiconductor memory device, the non-volatile semiconductor memory device comprising: a memory cell array comprising: a set of NAND cell units, each NAND cell unit comprising a memory string and a first and a second select gate transistor connected to the respective ends of the memory string, the memory string comprising a plurality of non-volatile memory cells connected in series; and a word line commonly connected to the control gates of the memory cells arranged in a direction intersecting the memory string;
 the method comprising:
 applying a write pulse voltage to a selected word line to perform a write operation to 1-page memory cells along the selected word line;
 performing a verify read operation to confirm whether data write to the 1-page memory cells is completed; and
 performing a step-up operation to raise the write pulse voltage by a certain step-up voltage according to the result of the verify read operation, the step-up operation being performed by changing the step-up voltage according to the distribution width of the first threshold voltage distribution generated in process of the write operation to the memory cells.

16. The method of writing according to claim 15, wherein
 the distribution width of the first threshold voltage distribution is determined by a read operation to a memory cell provided with the first threshold voltage distribution, using a voltage larger by a certain value than a verify voltage used in write of the first threshold voltage distribution.

17. The method of writing according to claim 15, wherein
 the non-volatile memory cells configured to store four-level data,
 the first threshold voltage distribution is an intermediate distribution generated from a negative threshold voltage distribution.

18. The method of writing according to claim 15, wherein
 the amount of the step-up voltage is decreased as the distribution width of the first threshold voltage distribution increases.

19. The method of writing according to claim 15, wherein the write operation is performed in the order of:
(1) a write operation of a first page to a first memory cell;
(2) a write operation of a first page to a second memory cell nearer to a bit line than the first memory cell;
(3) a write operation of a second page to the first memory cell;
(4) a write operation of the first page to a third memory cell nearer to the bit line than the second memory cell; and
(5) a write operation of the second page to the second memory cell.

20. The method of writing according to claim 19, wherein before the write operation of the second page to each memory cell is performed, a read operation is performed to confirm the distribution width of the first threshold voltage distribution provided by the write operation of the first page.

* * * * *